United States Patent [19]
Nakao et al.

[11] Patent Number: 5,939,947
[45] Date of Patent: Aug. 17, 1999

[54] PHASE SYNCHRONOUS CIRCUIT

[75] Inventors: Takehiko Nakao; Shinichi Yoshioka, both of Yokohama, Japan

[73] Assignee: Kabushiki Kaisha Toshiba, Tokyo, Japan

[21] Appl. No.: 08/831,096

[22] Filed: Apr. 1, 1997

[30]  Foreign Application Priority Data

Apr. 2, 1996 [JP] Japan ................................. 8-080208

[51] Int. Cl.[6] .............................. H03L 7/00; H03L 7/087
[52] U.S. Cl. ............................... 331/11; 331/1 A; 331/14; 331/25; 375/375; 327/159; 327/160
[58] Field of Search .................................. 331/10, 14, 11, 331/1 A, 25; 375/375, 376; 327/159, 160

Primary Examiner—Arnold Kinkead
Attorney, Agent, or Firm—Loeb & Loeb LLP

[57] ABSTRACT

A phase synchronous circuit, in the process of locking an internal signal to an input signal by a PLL loop, makes a frequency of the internal signal stepwise approximate to a frequency of the input signal under digital PLL control at a first stage, and adjusting a phase under analog PLL control at a next stage, thus controlling a variable frequency oscillator at the two stages. A gain with which an analog PLL control system is burdened can be thereby reduced, and a gain of VCO may not be set larger than required even if a frequency of an output signal $f_{out}$ is high.

10 Claims, 5 Drawing Sheets

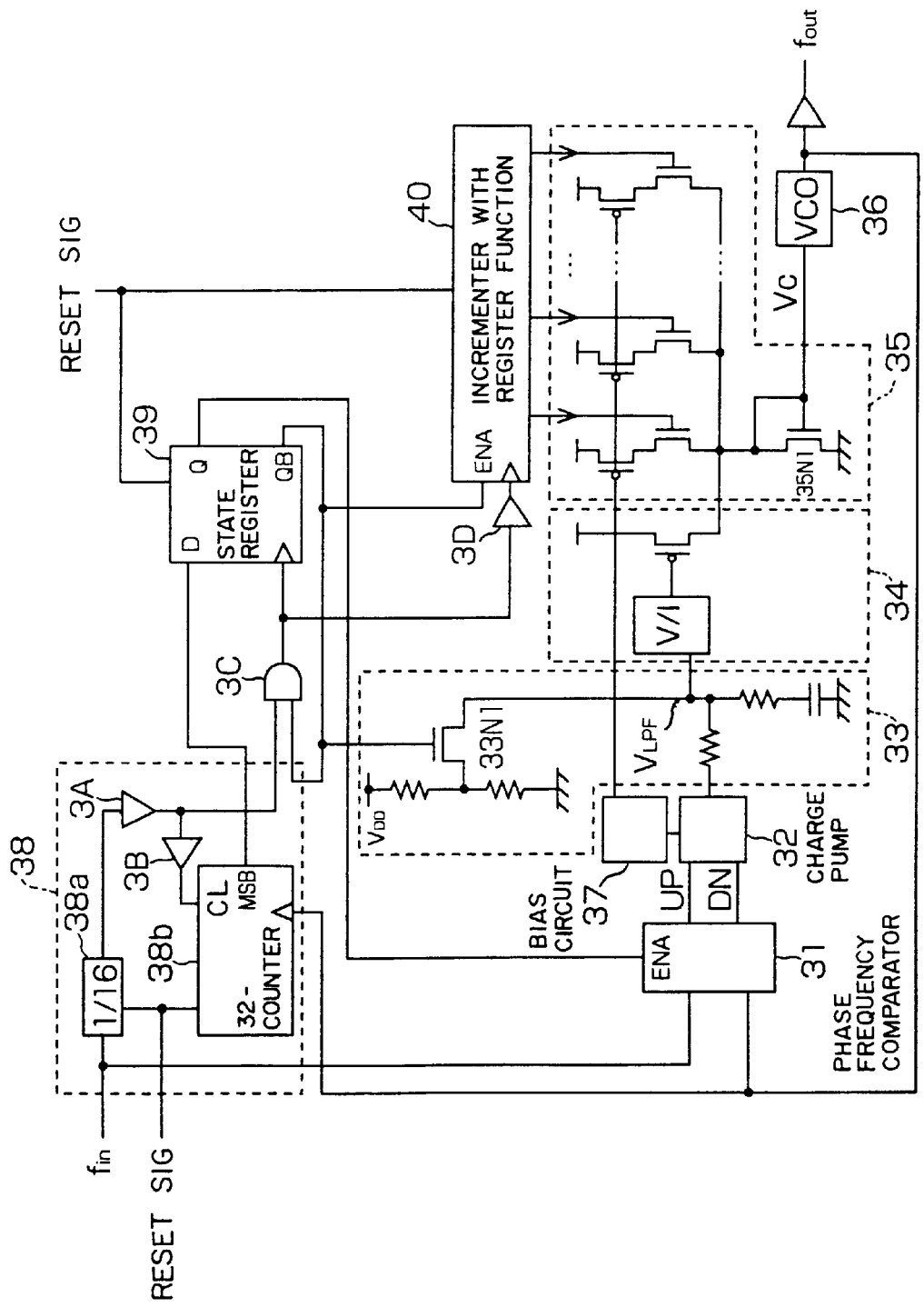
F I G. 1

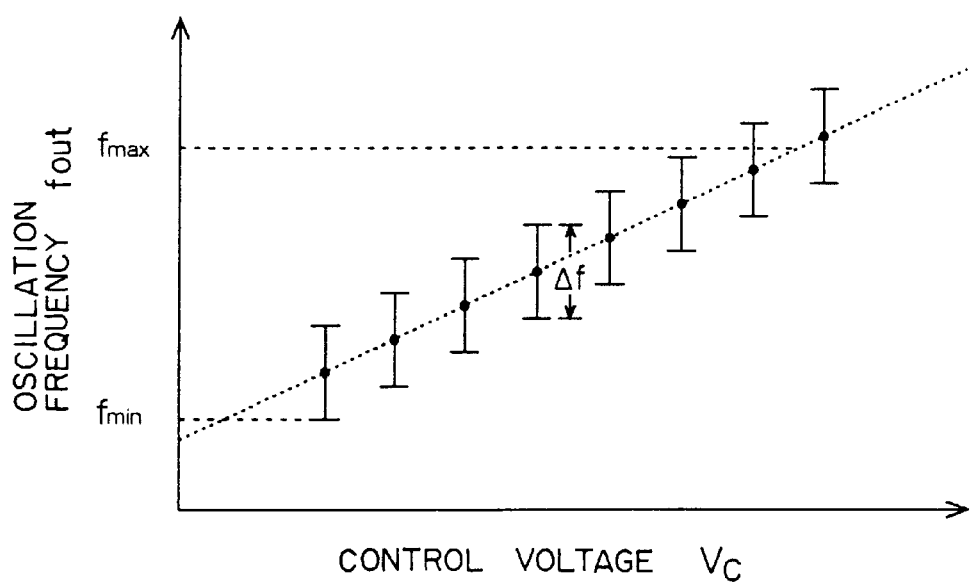
F I G. 2

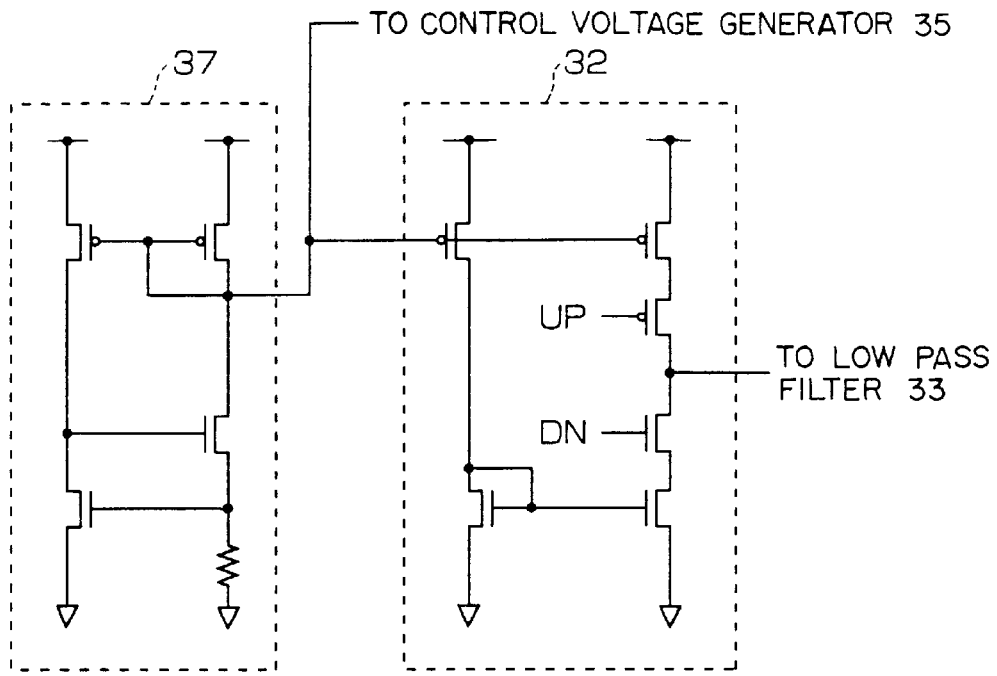
F I G. 4
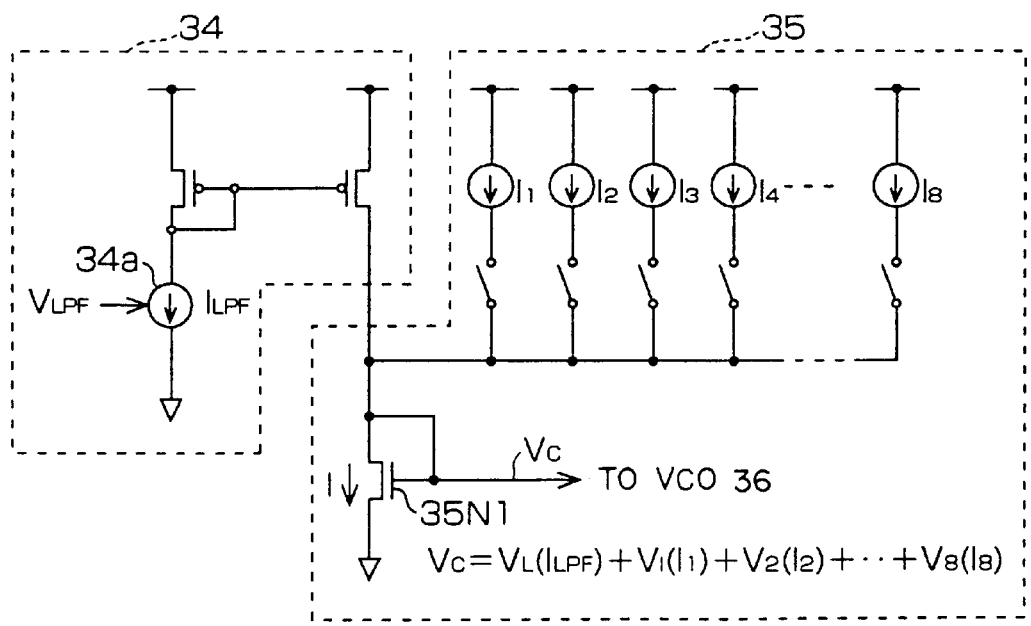
F I G. 5

PHASE SYNCHRONOUS CIRCUIT

BACKGROUND OF THE INVENTION

The present invention relates to an improvement of a phase synchronous circuit.

In recent years, with data communications speeded up and increasing in data quantity, and with microprocessors operating at higher speeds, an operating frequency of a synchronous circuit typified by a PLL (Phase Locked Loop) circuit has been increasingly getting high.

FIG. 7 illustrates a basic construction of a conventional PLL circuit. The PLL circuit is constructed of a phase comparator 11, a charge pump circuit 12, a low-pass filter 13, a VCO (Voltage Controlled Oscillator) 14 and a frequency-divider 15.

The phase comparator (including a phase frequency comparator) 11 detects a phase difference between a phase of a reference signal $f_s$ and a phase of a frequency dividing signal into which an output signal $f_{out}$ of the VCO 14 is frequency-divided by the frequency divider 15. If the phase of the frequency dividing signal is judged to be more delayed than the reference signal $f_s$ as a result of the detection, an up-signal UP is supplied to the charge pump circuit 12 for only a time proportional to the phase difference. Whereas if the phase of the frequency dividing signal is more advanced than the reference signal $f_e$, a down-signal DN is supplied to the same circuit 12 for only the time proportional thereto. The up-signal UP is used for advancing the phase of the output signal $f_{out}$ outputted from the PLL circuit, while the down-signal DN is used for delaying the phase of the output signal $f_{out}$ outputted from the PLL circuit. Upon receiving these two up- and down-signals UP, DN from the phase comparator 11, the charge pump 12 flows electric charges into a capacitor of the low-pass filter 13 disposed posterior during a period when the up-signal remains active, but draws the electric charges out of the capacitor during a period when the down-signal remains active, thus performing the charging/discharging process. This charging/discharging process is integrated by the low-pass filter, and the low-pass filter 13 outputs an output voltage Vc corresponding to a quantity of the electric charges accumulated in the capacitor. The VCO 14 is supplied with this output voltage Vc as a voltage for controlling the oscillation frequency. The VCO 14 changes the oscillation frequency corresponding to this control voltage Vc, and feedback control is executed so that the phase of the output signal $f_{out}$ of the PLL circuit follows up the phase of the reference signal $f_s$. Then, the frequency and the phase of the output signal $f_{out}$ generated by the PLL circuit coincide with the reference signal $f_s$. This phase coincident state is called a lock state. Note that the frequency divider 15 is used when multiplying the reference signal $f_s$ and generating a signal of a synchronized high frequency.

When the frequency of the reference signal $f_s$ to be synchronized becomes high, an oscillation frequency band of the VCO 14 also heightens, resulting in an increase in gain (control voltage variation $\Delta Vc$ versus output frequency variation $\Delta f_{out}$) of the VCO 14. This is illustrated in FIG. 8 which describes characteristics of the conventional PLL circuit. As will be obvious from FIG. 8, if the oscillation frequency band of the VCO 14 is high, an oscillation range of the VCO 14 must be broadly covered in order to generate a signal having a desired frequency.

However, a fluctuation width of the control voltage Vc of the VCO 14 does not increase, and hence an inclination of oscillation characteristic of the VCO 14 becomes steep. This implies that a slight fluctuation in the control voltage Vc of the VCO 14 causes a large fluctuation in the oscillation frequency $f_{out}$ of the VCO 14, and therefore a durability of the PLL circuit against noises is to be deteriorated. Further, if a power supply voltage of the circuit decreases because of a reduction in consumption electric power, the fluctuation width of the control voltage Vc of the VCO 14 is narrowed, with the result that the oscillation range demanded of the VCO 14 can not be secured.

SUMMARY OF THE INVENTION

Hence, it is a primary object of the present invention to provide a phase synchronous circuit capable of operating without setting a VCO gain larger than needed even if a frequency of an output signal $f_{out}$ is high.

It is another object of the present invention to provide a phase synchronous circuit capable of locking a reference signal over a wide frequency range even when a range of a VCO control voltage Vc is narrowed by, for example, reduced power supply voltage.

According to the first aspect of the present invention, there is provided a phase synchronous circuit for synchronizing an internal signal with an input signal by controlling a variable frequency oscillator based on a frequency/phase difference between the internal signal and the input signal supplied, said synchronous circuit comprising:

a digital control loop system for discretely controlling an oscillation frequency of said variable frequency oscillator in accordance with the frequency difference between the input signal and the internal signal, and making the frequency of the internal signal approximate to the frequency of the input signal;

an analog control loop system for consecutively controlling oscillations of said variable frequency oscillator in accordance with the phase/frequency difference between the input signal and the internal signal;

detecting means for detecting the frequency approximation between the input signal and the internal signal; and control loop switching means for switching control of said variable frequency oscillator from the digital control loop system to the analog control loop system in accordance with the detection of the frequency approximation by operating the digital control loop system in advance of the analog control loop system.

According to the second aspect of the present invention, there is provided a phase synchronous circuit comprising:

a variable frequency oscillator for generating an internal signal having a frequency corresponding to a control voltage supplied;

frequency comparing means for comparing a magnitude of frequency between the internal signal and an input signal supplied;

first control voltage generating means for outputting a first control voltage a level of which changes stepwise corresponding to a result of the comparison of the frequency;

frequency/phase comparing means for outputting a difference signal indicating at least one of a frequency difference and a phase difference between the internal signal and the input signal supplied;

second control voltage generating means for outputting a second control voltage a level of which consecutively changes corresponding to the difference signal;

voltage superposing means for forming the control voltage by superposing the first and second control voltages; and approximating state detecting means for operating said first control voltage generating means till the frequencies of the input signal and the internal signal approximate each other, making said first control voltage generating means hold an output voltage thereof after the frequencies have approximates each other, and operating said control voltage generating means.

According to the present invention, in the process of locking an internal signal to an input signal with a PLL loop, a frequency is made approximate stepwise to a frequency of the input signal under digital control at a first stage, and a phase is adjusted under analog control at a next stage, thus controlling a variable frequency oscillator at the two stages.

Thus, since advantageous features of both the digital control and the analog control are combined, the gain with which an analog group is burdened can be thereby set relatively low. Further, with a quick approximation to a target frequency at the fist stage, the frequency and phase can be finely adjusted thereafter, and therefore speedy locking (phase synchronization) can be attained.

BRIEF DESCRIPTION OF THE DRAWINGS

FIG. 1 is a block circuit diagram showing an embodiment of the present invention;

FIG. 2 is an explanatory graph showing a VCO oscillation characteristic when the present invention is applied;

FIG. 4 is a circuit diagram showing an example of constructions of a charge pump circuit 32 and a bias voltage generating circuit 37;

FIG. 5 is an explanatory diagram showing operations and an example of constructions of an analog control voltage generating unit 34 and a digital control voltage generating unit 35;

DESCRIPTION OF THE PREFERRED EMBODIMENTS

Figure 3:
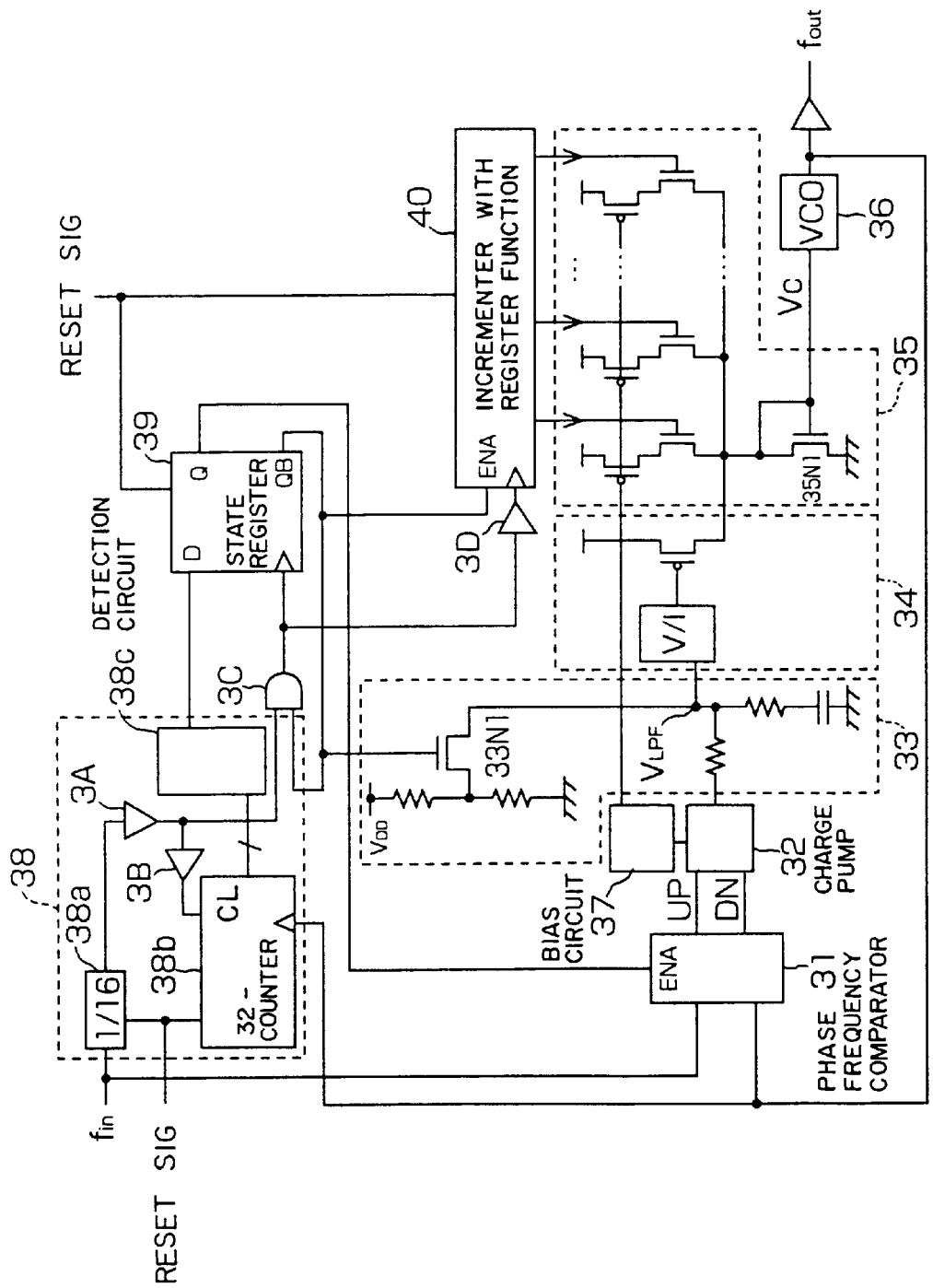
FIG. 3 is an explanatory block circuit diagram showing another embodiment of the present invention.

An embodiment of the present invention will be discussed with reference to FIG. 1. A phase synchronous circuit illustrated in FIG. 1 is roughly classified into a digital control loop system and an analog control loop system. The digital control loop system stepwise (discretely) sets an oscillation frequency of the VCO in an initial lock process of the PLL loop, thereby making an internal signal outputted by the VCO approximate to a frequency of an input signal (signal to be synchronized). The digital control loop system executes, as it were, digital oscillation frequency control. On the other hand, the analog control loop system, after the frequency of the internal signal has become a value in the vicinity of the input signal frequency, consecutively controls the oscillation frequency of the VCO, thereby bringing the PLL loop into a lock state.

The digital control loop system comprises a frequency comparing unit 38 consisting of a 16– ($2^4$–) frequency-divider 38a for dividing a comparison input signal $f_{in}$ by 16, and a 32– ($2^5$–) counter 38b for generating a count output at an interval of 32 pulses of the input signal supplied. The digital control loop system also comprises a state register 39 serving as a approaching state detecting unit constructed of a D flip-flop, an incrementer with a registering function (hereinafter simply called an incrementer) 40, and a delay elements 3A, 3B, 3D used for a timing adjustment, etc. The digital control loop system further comprises an AND gate 3C for supplying AND of an output of the frequency divider 38a and an output QB (inverted output of an output Q) of the state register 39, as a clock to the state register and an increment signal of the incrementer 40, a digital control voltage generating unit 35, and a VCO 36. The frequency comparing unit 3B compares the input signal with the output signal $f_{out}$ of the VCO 36 and, if the output signal $f_{out}$ exceeds a frequency of the input signal $f_{in}$, generates an output MSB. The incrementer 40 having the same construction as a shift register goes on additionally setting "1" sequentially to a plurality of registers each time a rise edge comes out. The 16-frequency-divider 38a, the 32-counter 38b, the state register 39 and the incrementer 40 are subjected to an initial reset by a reset signal as in the same way with the normal digital circuit when switching ON a power supply of each circuit.

The analog control loop system is constructed of a phase (or frequency phase) comparator 31, a charge pump 32, a low-pass filter 33, a variable current source 34, an analog control voltage generating unit 34, a VCO 36, and a constant current source bias circuit 37. The phase comparator 31 compares the input signal $f_{in}$ with a frequency and a phase of the output signal $f_{out}$ and, if the frequency and the phase of the output signal $f_{out}$ are more delayed than the input signal fin, generates an up-signal UP. Further, if the frequency and the phase of the output signal $f_{out}$ are more advanced than the input signal $f_{in}$, the phase comparator 31 generates a down-signal DN. The low-pass filter 33 includes a resistance voltage dividing circuit connected between the earth and, e.g., a power supply VDD as shown in FIG. 1. A predetermined voltage, preferably, a voltage (½) VDD is thereby obtained and supplied to an output terminal of the low-pass filter 33 via a switch transistor 33N1. The transistor 33N1 for controlling this supply is controlled by the output QB of the state register 39.

FIG. 4 illustrates an example of configurations of the constant current source bias circuit 37 and of the charge pump 32. A bias voltage generated by the constant current source bias circuit 37 turns out to be A PMOS gate bias of the digital control voltage generating unit 35 as well as of the charge pump 32. The up- and down-signals UP, DN of the phase (or frequency phase) comparator 31 are supplied respectively to gates of PMOS and NMOS of the charge pump 32.

FIG. 5 schematically shows configurations of the analog control voltage generating unit 34 and of the digital control voltage generating unit 35. The analog control voltage generating unit 34 is constructed of a current source 34a for outputting an electric current ILPF corresponding to an output VLPF of the low-pass filter, and a current mirror circuit consisting of PMOS transistor for transferring the current ILPF. The digital control voltage generating unit 35 is constructed of eight pieces of PMOS transistors functioning as current sources I1–I8 with gates receiving outputs of the bias voltage generating circuit 37, and eight pieces of NOMS transistor switches respectively connected to the PMOS transistors. The NMOS transistor switches is individually controlled by outputs of shift registers of the incrementer 40. The current ILPF and output currents of the current sources I1–I8 are converged at an NMOS transistor 35N1. A drain and a gate of the transistor 35N1 are connected, and a maximum gate voltage Vc thereof is given by:

$$Vc=VL(ILPF)+V1(I1)+V2(I2)+\ldots+V8(I8)$$

This maximum gate voltage Vc becomes a control voltage of the VCO 36.

Figure 6:
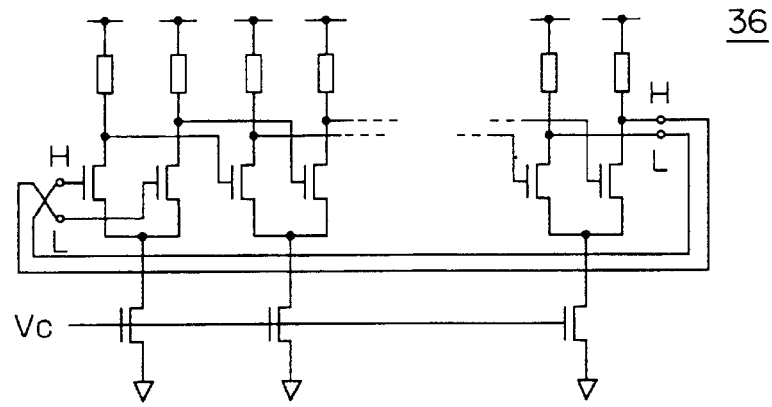
FIG. 6 is a circuit diagram showing an example of a construction of the VCO.
Figure 7:
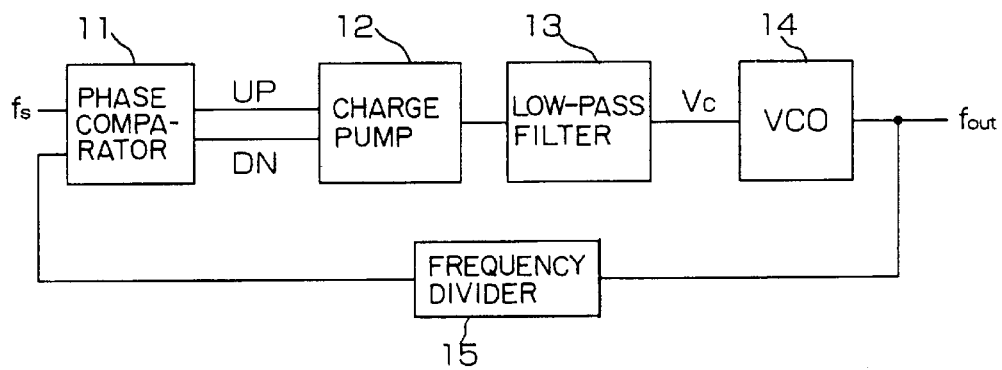
FIG. 7 is an explanatory block circuit diagram illustrating a basic construction of a conventional PLL circuit.
Figure 8:
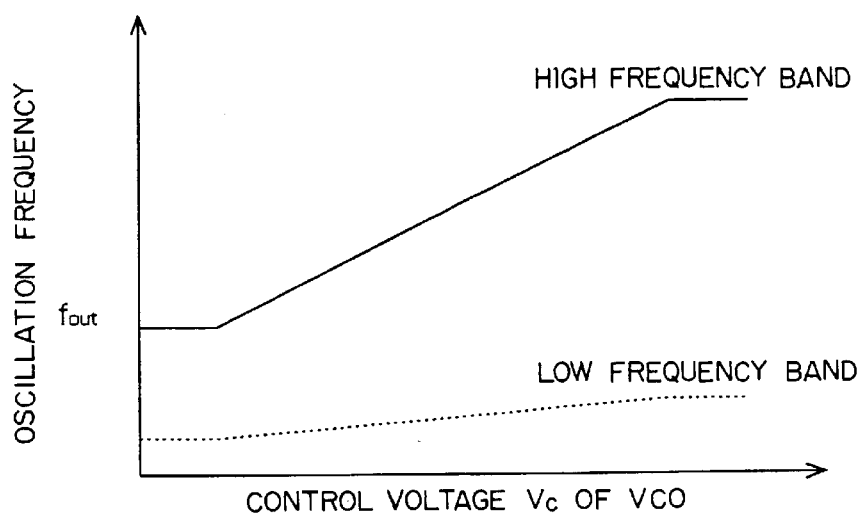
FIG. 8 is an explanatory graph showing an oscillation characteristic demanded of the VCO when using the construction in FIG. 7.

FIG. 6 illustrates an example of a configuration of the VCO 36. In this example, the VCO 36 comprises an ring oscillator with differential transistor circuits connected in vertical lines. The transistor 35N1 constitutes a current mirror circuit and a current source transistor of the differential transistor circuit, and supplies each current source transistor with a current corresponding to the control voltage Vc. An amplitude of the output voltage is controlled by this current, and an oscillation frequency of the ring oscillator is thereby set. With the ring oscillator consisting of the differential transistor circuits, there might be advantages in terms of a low power supply voltage operation, a power supply noise resisting characteristic, etc.

Next, an operation of the digital control loop system will be explained. The digital control loop system operates in advance of the analog control loop system. Making the operation of the digital control loop system anterior to the operation of the analog control loop system, involves making non-active an enable terminal ENA of the phase comparator 31 of the analog control loop system by "L" of an output Q after the state register 39 has been reset. Further, there is made conductive an NMOS transistor 33N1 of the low-pass filter 33 by "H" of an output QB defined as an inverted output of the output Q of the state register 39. Upon the conduction of the transistor 33N1, the output of the low-pass filter 33 is forcibly set to (½) VDD. A more detailed description of the state register 40 will be given later on.

PLL control by the analog control loop system is stopped, during which a frequency of the input signal $f_{in}$ is compared with a frequency of the output signal $f_{out}$ in the digital control loop system. This frequency comparison is executed by use of the 16-frequency-divider 38a and the 32-counter 38b of the frequency comparator 38, the delay elements 3A, 3B, the AND gate 3C, and the state register 39.

To start with, a divided-by-16 frequency signal of the input signal is generated by letting the input signal $f_{in}$ through the 16-frequency-divider 38a. On the other hand, the counter 38b counts up with the output signal $f_{out}$ of the VCO 36. At an early stage of the operation of the PLL circuit, the oscillation frequency of the VCO 36 is lower than the input signal $f_{in}$. When examining a count value of the counter with a period of the divided-by-16 frequency signal of the input signal $f_{in}$, the value is still less then 16, and MSB (Most Significant Bit) f the count value of the counter 38b is "0". This MSB value "0" is inputted to the state register 39.

The state register 39 is, as described above, actualized by the D flip-flop. The output QB (inverted value of the output Q) thereof initially assumes an "H" level by resetting with the reset signal when switching ON the power supply. The AND gate 3C outputs "H" for the duration of the "H" level of the signal with the delayed output of the frequency divider 38a. An output of this gate 3C is applied to a clock input terminal of the state register 39. Accordingly, a value of the state register 39 is updated with a ¹⁄₁₆ period of the input signal.

The output QB of the state register 39 is connected to the enable terminal ENA of the incrementer 40 disposed at the next stage, and hence, during a period when a value thereof is "H", i.e., when the oscillation frequency of the output signal $f_{out}$ of the VCO 36 is judged to be lower than the frequency of the input signal $f_{in}$, the incrementer 40 goes on incrementing a holding value thereof each time the output signal from the AND gate 3C changes from "L" to "H". The "H" level is applied sequentially to corresponding gates of the NMOS of the control voltage generating unit 35 in accordance with values of the incrementer 40. it follows that as the value of the incrementer 40 becomes larger, the more current flows in the NMOS transistor 35N1 of the control voltage generating unit 35. Consequently there increases the current of each of the current sources of the ring oscillator within the VCO 36 that serves as a current mirror and the transistor 35N1, and the oscillation frequency of the VCO 36 heightens.

Before long the sufficient current flows in the NMOS transistor 35N1 within the control voltage generating unit 35, and the oscillation frequency of the VCO 36 becomes higher than the input signal $f_{in}$. Hereupon, the count value of the counter 38b is 16 or larger, and "1" is set in the MSB. When this is transferred to the state register 39, the output QB thereof becomes "L", and an output of the AND gate 3C is invariably fixed to "L" without depending on the output of the 16-frequency-divider 38a. Accordingly, a value of the state register 39, in which the output of the AND gate 3C serves as a clock input, is not thereafter updated at all. Note that the value of the counter 38b is cleared after the MSB value has been transferred to the state register 39, and the counter 38b resumes counting up.

Further, the incrementer 40, because of the output QB of the state register becoming "L", does not perform the increment operation thereafter. Since the output Q of the state register 39 assumes "H", the phase comparator 31 is activated. Then, the transistor 33N1 of the low-pass filter 33 is cut off, and the primary output VLPF of the low-pass filter 33 is activated. At this stage, the system control is transferred to the analog control loop system.

Confirming how the value of the state register 39 changes, initially the output Q is "L", while the output QB is "H". When shifted to the analog control, however, the output Q assumes "H", while the output QB assumes "L".

Accordingly, the output Q is connected to the enable terminal of the phase comparator 31, and the output QB is connected to the gate of the NMOS transistor 33N1 within the low-pass filter 33. Thus, it is feasible to commence the operation soon after being shifted to the analog control from the digital control without initially operating the phase comparator 31. Further, the low-pass filter 33 is initially made to output a fixed value of ½ VDD, and the charge pump is made to commence charging and discharging immediately after shifting to the analog control. The output of the low-pass filter is thereby brought into the control state.

Herein, in the example of FIG. 1, the output of the low-pass filter 33 remains fixed to ½ VDD during an adjustment of the frequency on the digital side, but may be fixed to other potentials such as VDD, etc.

Next, when shifted to the analog control, the phase comparator 31 and the low-pass filter 33 are activated. The phase comparator 31, the charge pump 32, the low-pass filter 33, the analog control voltage generating unit 34, the control voltage generating unit 35 and the VCO 36 are combined to form a PLL loop, and this loop starts operating.

The output signal $f_{out}$ of the VCO 36 has already had a frequency in the vicinity of the frequency of the input signal $f_{in}$, and hence it may suffice thereafter to simply adjust the phase (or frequency and phase) of the output signal $f_{out}$. Accordingly, there is no necessity for the output VLPF of the low-pass filter 33 to cover the whole oscillation range of the VCO 36, and there may be consecutive interpolations in between the increment widths with which to fluctuate the frequency stepwise can be set approximately twice as wide as a frequency interval ($\Delta f/2$) of the discrete oscillation frequency in charge of the digital control system. The output voltage VPF of the low-pass filter 33 is converted into the current ILPF through the analog control voltage generating unit 34 and superposed with output currents I1, I2, ... by the digital control voltage generating unit 35 to become the control voltage Vc, thereby finely adjusting the oscillation frequency of the VCO 36.

FIG. 2 shows a characteristic of the VCO 36 in the embodiment shown in FIG. 1. Referring to FIG. 2, the axis of ordinates indicates the oscillation frequency of the VCO 36, and the axis of abscissa indicates the control voltage Vc of the VCO 36. In FIG. 2, the black point represents a frequency in the case of executing the discrete control (digital control) under which the output of the low-pass filter is fixed to ½ VDD. A value of this frequency is stepwise incremented by the incrementer. Then, just when exceeding slightly a target frequency, the control is shifted to the analog control, and the phase is adjusted within the tolerant range defined by error bars this time.

Hitherto, all the values from the minimum value $f_{min}$ up to the maximum value $f_{max}$ of the normal using frequency range must be covered within the voltage variable range of the output of the low-pass filter 33. The gain KVCO of the VCO 36, which is defined as one of parameters representing the characteristic of the PLL loop system, is expressed such as:

$$\text{KVCO} = (f_{max} - f_{min})/\Delta V \qquad \text{(Formula 1)}$$

where $\Delta V$ is the fluctuatable range of the output VLPF of the low-pass filter 33.

On the other hand, if the present invention is applied, an oscillation range (designated by $\Delta f$) corresponding to the error bars may be covered within the fluctuatable range of the output VLPF of the low-pass filter 33, and therefore the gain KVCO of the VCO at this time is given by:

$$\text{KVCO} = \Delta f/\Delta V \qquad \text{(Formula 2)}$$

Further, if the power supply voltage is decreased for reducing the consumption electric power, a level range of the output voltage VLPF of the low-pass filter 33 is narrowed. Then, it is very hard to secure the high frequency oscillation in a broad range according to the prior art. If the present invention is applied, however, the digital control loop system increases the frequency up to a value in the vicinity of the desired value (input signal frequency), and hence, even if the frequency range covered by the output voltage VLPF of the low-pass filter 33 is narrow, it is possible to correspond to the high frequency band.

Note that the input signal $f_{in}$ is compared directly with the output signal $f_{out}$ of the VCO 36 in the embodiment shown in FIG. 1, and therefore, the frequency divider is, though not provided posterior to the VCO 36, need in such a case that the high frequency input signal $f_{in}$ is generated by dividing/multiplying the reference signal with a divider/multiplier. Even when the frequency divider is inserted posterior to the VCO 36, the characteristic of the present invention that the control shifts from the digital control to the analog control, remains unchanged. The frequency divider after the VCO 36 can be incorporated into the PLL loop as the necessity in terms of design arises.

FIG. 3 shows another embodiment. Referring to FIG. 3, the units corresponding to those in FIG. 1 are marked with the same reference numerals, and the explanations of such units are omitted. Provided in this embodiment is a detection circuit 38c for monitoring an N-bit output of the counter 38b. Other configurations are the same as those in FIG. 1.

The detection circuit 38c is constructed of a logic circuit and capable of distinguishing the output values of the counter 38b. When the output of the counter 38b is a value in the vicinity of MSB, e.g., "(MSB) 001 . . . 1 (LSB)", the detection circuit 38c generates an output signal for setting a state register 40. In the embodiment shown in FIG. 1, the control shifts from the digital control state for discretely setting the oscillation frequency, to the analog control state for consecutively controlling the oscillation frequency by the MSB output of the counter 38b. If the MSB output is set as a criterion for distinction, there appears such a tendency that the oscillation frequency of the VCO 36 is temporarily brought into a frequency descent state from a frequency ascent state and then locked to the input signal $f_{in}$ (or reference signal $f_s$). In contrast with this, according to the construction illustrated in FIG. 3, the control switched over from the digital control to the analog control just before the MSB output from the counter 38b. Therefore, in the process of a frequency increasing tendency, it can be expected that the PLL loop is locked to the input signal $f_{in}$ so as not to cause an excess of the frequency of the output signal $f_{out}$ over the frequency of the input signal $f_{in}$. Accordingly, there must be an advantage in which the outputs of the VCO 36 can be converged in a non-oscillatory manner.

Further, the frequency comparator 38 shown in FIG. 1 can be also actualized by use of an N-bit counter for counting up by the input signal, and a counter of (N+1) or more bits, for counting up by the VCO output $f_{out}$. In this case, during a period when the count value on the VCO output side does not exceed the count value on the input signal side, the comparing unit outputs the "L" level but the "H" level if over the latter count value.

As discussed above, according to the present invention, the VCO gain (control input voltage versus oscillation frequency) versus the output voltage of the low-pass filter may not be set higher than needed. Hence, even if the frequency of the signal to be synchronized is high, the noise resisting characteristic can be prevented from declining. Moreover, in the case of using LSI in which the power supply voltage of the circuit tends to decrease, it is feasible to actualize the PLL circuit capable of locking over a wide range of frequencies even when the output voltage range of the low-pass filter is narrow.

What is claimed is:

1. A phase synchronous circuit for synchronizing an internal signal with an input signal by controlling a variable frequency oscillator based on a frequency or phase difference between the internal signal and the input signal supplied, said synchronous circuit comprising:

a digital control loop system for discretely controlling an oscillation frequency of said variable frequency oscillator in accordance with the frequency difference between the input signal and the internal signal, and making the frequency of the internal signal approximate to the frequency of the input signal;

an analog control loop system for consecutively controlling oscillations of said variable frequency oscillator in accordance with the frequency or phase difference between the input signal and the internal signal; and detecting means for detecting a frequency approximation between the input signal and the internal signal; and control loop switching means for switching control of said variable frequency oscillator from the digital control loop system to the analog control loop system in accordance with the detection of the frequency approximation by operating the digital control loop system in advance of the analog control loop system.

2. The phase synchronous circuit according to claim 1, wherein an oscillation frequency range covered by the analog control loop system is set approximately twice as wide as a frequency interval in discrete frequency oscillations covered by the digital control loop system.

3. A phase synchronous circuit comprising:

a variable frequency oscillator for generating an internal signal having a frequency corresponding to a control voltage supplied;

frequency comparing means for comparing a magnitude of frequency between the internal signal and an input signal supplied;

first control voltage generating means for outputting a first control voltage a level of which changes stepwise corresponding to a result of the comparison of the frequency;

frequency or phase comparing means for outputting a difference signal indicating at least one of a frequency difference and a phase difference between the internal signal and the input signal supplied;

second control voltage generating means for outputting a second control voltage a level of which consecutively changes corresponding to the difference signal;

voltage superposing means for forming the control voltage by superposing the first and second control voltages; and approximating state detecting means for operating said first control voltage generating means till the frequencies of the input signal and the internal signal approximate each other, making said first control voltage generating means hold an output voltage thereof after the frequencies have approximated each other, and operating said second control voltage generating means.

4. The phase synchronous circuit according to claim 3, wherein said frequency comparing means comprises:

a frequency dividing circuit for dividing a frequency of the input signal by $2^N$, and an (N+1) bit counter for counting the internal signal, a count value being rest in response to an output of said frequency dividing circuit.

5. The phase synchronous circuit according to claim 3, wherein said frequency comparing means comprises:

an N-bit counter circuit for counting the input signal;

an (N+1) bit counter circuit for counting the internal signal; and a comparing circuit for comparing count values of said two counters.

6. The phase synchronous circuit according to claim 3, wherein said frequency comparing means comprises:

a frequency dividing circuit for dividing a frequency of the input signal by $2^N$;

an (N+1) bit counter for counting the internal signal, a count value being reset by an output of said frequency dividing circuit; and a circuit for distinguishing a value of said (N+1) bit counter.

7. The phase synchronous circuit according to claim 3, wherein said approximating state detecting means includes storage means capable of functioning as a D flip-flop upon inputting an output of most significant bit of said (N+1) bit counter, and generates and holds an approximating state detection output representing an approximation of the frequencies of the input signal and the internal signal when the output of the most significant bit is inputted.

8. The phase synchronous circuit according to claim 3, wherein said first control voltage generating means includes:

an incrementer for sequentially setting bit values of a plurality of bit registers in response to outputs of said frequency dividing circuit till the approximating state detection output is generated; and current generating means for generating a current corresponding to the value set in said registers.

9. The phase synchronous circuit according to claim 3, wherein said frequency or phase comparing means stops an operation thereof till an approximating state detection output is generated; and said second control voltage generating means fixes the second control voltage till an approximating state detection output is generated.

10. The phase synchronous circuit according to claim 3, further comprising:

a divider or multiplier for dividing or multiplying the input signal and supplying it to said frequency comparing means and said frequency or phase comparing means; and a second frequency divider for dividing a frequency of the internal signal and supplying it to said frequency comparing means and said frequency or phase comparing means.

* * * * *